United States Patent [19]

Matsunaga et al.

[11] Patent Number: 5,440,675
[45] Date of Patent: Aug. 8, 1995

[54] METHOD FOR RESOURCE ALLOCATION & SCHEDULING, AND SYSTEM THEREFOR

[75] Inventors: Tomoko Matsunaga, Kumamoto; Tamotsu Nishiyama, Hirakata, both of Japan

[73] Assignee: Matsushita Electric Industrial Co., Ltd., Osaka, Japan

[21] Appl. No.: 341,971

[22] Filed: Nov. 16, 1994

Related U.S. Application Data

[63] Continuation of Ser. No. 804,031, Dec. 9, 1991, abandoned.

[30] Foreign Application Priority Data

Jun. 13, 1991 [JP] Japan .................................. 3-141653

[51] Int. Cl.⁶ .............................................. G06F 15/00
[52] U.S. Cl. ................................................ 395/140
[58] Field of Search ................ 395/155, 161, 140; 345/24, 27

[56] References Cited

U.S. PATENT DOCUMENTS

3,735,109  5/1973  Berthelemy et al. ................. 235/185

FOREIGN PATENT DOCUMENTS

0363017  4/1990  European Pat. Off. .
0495517  7/1992  European Pat. Off. .

OTHER PUBLICATIONS

"Power Generation Scheduling Through Use of Generalized Network Flow Programming", Rice et al., IEEE Proceedings-C, vol. 138, No. 1, Jan. 1991, p. 39–46.

"Graphs and Hypergraphs", Claude Berge, 1979, pp. 76–101.

*Primary Examiner*—Phu K. Nguyen
*Attorney, Agent, or Firm*—Wenderoth, Lind & Ponack

[57] ABSTRACT

An analyzing method for resource allocation and scheduling enhances simplification and speed-up of the process without employing a linear programming method, but based on an experimental method. The method uses a network consisting of nodes and branches for a model of resource allocation. In a network composed of extracted strongly connected components, the weight of each branch is repeatedly determined so that the sum of the weight of the input branches is equal to the sum of the weight of the output branches at each node. Furthermore, a branch having the maximum weight is detected in the network, so that the nodes are scheduled.

15 Claims, 18 Drawing Sheets

52 Connecting line
51 Block 62
61 crosspoint
63 strongly connected component

Pattern 1

Pattern 2

Pattern 3

Pattern 4

Pattern 5
(default)

Fig. 8
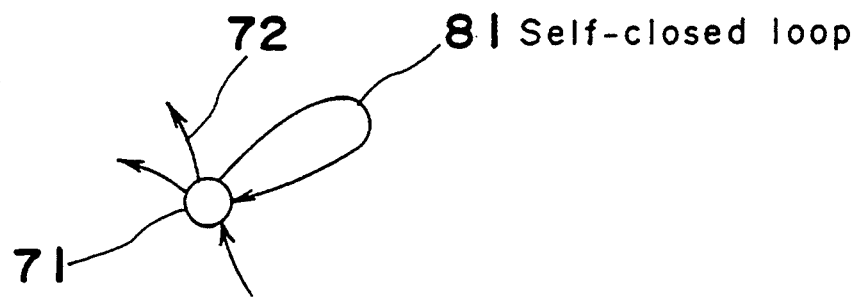
Fig. 9
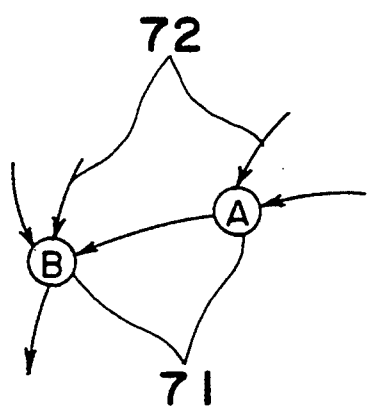
Fig. 10(a)    Fig. 10(b)
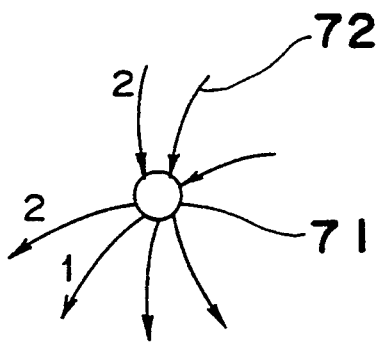 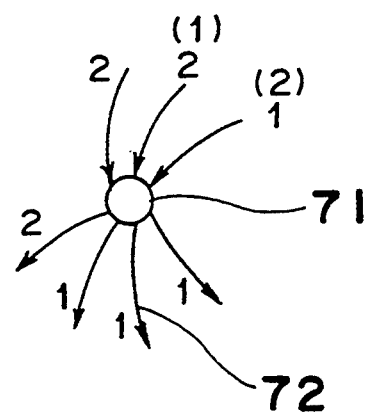

METHOD FOR RESOURCE ALLOCATION & SCHEDULING, AND SYSTEM THEREFOR

This application is a continuation of now abandoned application, Ser. No. 07/804,031, filed Dec. 9, 1991 now abandoned.

BACKGROUND OF THE INVENTION

1. Field of the Invention

The present invention relates to a method for resource allocation/analysis and scheduling, and a system therefor designed for optimum allocation of workers or materials in production management, scheduling of the manufacturing process or computing procedures, or layout of logic diagrams or functional charts, etc.

2. Description of the Prior Art

In order to analyze and solve the allocation of resources, scheduling or the maximum flow which can be represented by a network, there have been methods using a graphic theory and a linear programing method.

According to the method using the graphic theory, a concept of a flow is employed with respect to a network, so that the aforementioned kind of problem is analyzed as a problem of the flow. The problem of the maximum flow is one of the flow problems. The flow problem can be analyzed, for example, according to a procedure proposed by Dinic which is disclosed in "Practice of Graphic Theory-Basis and Application-" (1983). According to the method by Dinic, the maximum flow from an entrance to an exit of a network is obtained by repeatedly searching for the shortest incrementable path among allowable flows set for each branch. A flow which occurs when the shortest incrementable path is not present is regarded as the maximum flow.

Meanwhile, according to the linear programming method, the relationship between the inflow and outflow in the whole network or at each node, and the restrictions of the flow rate, etc. at each branch and a corresponding objective function are analyzed by a simplex method revealed in "Guide to Linear Programming Method" (1980). Karmarkar's method is found in Japanese Laid-Open Patent Publication No. 02-244261. The simplex method is the most general method among the linear programming methods, whereby various restrictions in the network are constructed into a model, so that a solution to make the objective function optimum is repeatedly selected so as to thereby obtain the optimum solution while a practicable solution to satisfy the restrictions is set as an initial value. The Karmarkar method was devices to speed-up the linear programming method. Since the efficiency of selecting a solution is increased more than by the simplex method, the number of repetitions until the optimum value is obtained is reduced so much as to obtain the solution in real time. Moreover, even the case where a solution cannot be obtained by the simplex method can be analyzed in accordance with Karmarkar's method.

However, there is a disadvantage in the conventional analyzing method, i.e., the method of Dinic in that as the scale of the network is increased or becomes more complicated due to the repeated operations to search for the incrementable path from the entrance to the exit of the network, more time is required.

When a solution is repeatedly searched or a value of the objective function is calculated, by the simplex method, it is necessary to operate matrices of degrees proportional to the number of the restrictions and therefore, the operating or computing time becomes proportional to a square of the number of the restrictions regardless of the scale of the network. In many cases, it is even impossible to obtain a solution.

On the other hand, although Karmarkar's method realizes high-speed processing nearly in real time, operations of matrices are still necessary and the procedure cannot help but be complicated as a consequence of the enlargement of the scale of the network.

SUMMARY OF THE INVENTION

An object of the present invention is therefore to provide a method for resource allocation and scheduling, and a system therefor, whereby an object to be analyzed is expressed by a network including a closed loop constituted of nodes and branches, and the weight of each branch is determined through a partial search of the network, without employing the searching method of an incrementable path by Dinic or the like or a linear programming method, but rather by repeating simple procedures in a short time.

In order to achieve the aforementioned object, according to the method for resource allocation of the present invention, nodes representing the status of an object to be analyzed are classified so that the outflow and inflow of the weight of branches representing the status transition at each node are equal to each other and, moreover, the sum of the weight of the branches in the whole model of a graph consisting of the nodes and branches and including a closed loop is minimized, whereby the weight of each branch is obtained. In other words, this is a method for resource allocation to a linear programming model of a graph consisting of nodes representing the status and branches representing the status transition, and including a closed loop, comprising:

a step 1 of selecting a node from which to start a determination of the weight of branches among all of the nodes in the graph; and a step 2 of classifying the nodes depending on the determined state of the weight of input branches and output branches of the selected node, and of weighing all of the input branches $x_{ji}$ and output branches $x_{ij}$ of every classified pattern of nodes i so that $$y = \sum_{(i,j)} x_{ij}$$

is minimized under a constraint represented by the following equation (1) $\Sigma_j x_{ij} - \Sigma_j x_{ji} = 0$, $x_{ij} \geq 0$, whereby all of the branches in the graph are weighted by repeating steps 1 and 2. The resource allocation of the present invention in the above-described configuration is further characterized in that a strongly connected component is extracted from a graph consisting of nodes representing the status and branches representing the status transition, and including closed loops so that all of the branches in the graph are weighted for a model having self-closed loops removed from one or a plurality of the strongly connected components.

According to the analyzing method of the maximum flow of the present invention, in the same manner as in the allocation of resources described above, a weight of each branch in the network of a model is obtained so as to thereby detect a branch of the maximum weight. A value of the maximum flow and a branch of the maximum flow can be obtained. More specifically, the analysis of the maximum flow to a model of a graph consisting of nodes and branches and, including closed loops is comprised of:

a step 1 of selecting a node from which to start a determination of the flow rate among all the nodes in the graph;

a step 2 of classifying the nodes depending on the determined state of the flow rate of input branches and output branches of the selected node, and of determining the flow rate of all of the input branches $x_{ji}$ and output branches $x_{ij}$ of every classified pattern of nodes i so that $$y = \sum_{(i,j)} x_{ij}$$

is minimized under constraint of the equation (1);

a step 3 of determining the flow rate of all of the branches in the graph by repeating steps 1 and 2; and a step 4 of detecting a branch having the maximum flow rate among all of the branches in the graph, so as to thereby obtain the branch with the maximum flow in the graph and the flow rate.

According to the scheduling method embodied by the present invention, similar to the analysis of the maximum flow described hereinabove, a branch forming the maximum flow in the network of a model is obtained and cut, so that nodes included in a closed loop are arranged in order. That is, the scheduling method to a model of a graph consisting of nodes representing the status and branches representing the status transition, and including closed loops is comprised of:

a step 1 of selecting a node from which to start determination of the weight of branches among all of the nodes in the graph;

a step 2 classifying nodes depending on the determined state of the weight of input branches and output branches of the selected node, and of weighing all of the input branches $x_{ji}$ and output branches $x_{ij}$ of every classified pattern of nodes i so that $$y = \sum_{(i,j)} x_{ij}$$

is minimized under the constraint of equation (1);

a step 3 of determining the weight of all of the branches in the graph by repeating steps 1 and 2;

a step 4 of detecting a branch with the maximum weight among all the branches in the graph; and a step 5 of arranging all of the nodes constituting the closed loop in order by removing the branch with the maximum weight detected in step 4 and cutting the closed loops including the branch.

According to the present invention, since nodes to be processed to determine the weight of branches in the resource allocation, scheduling or analysis of maximum flow are classified into patterns, the process can be carried out in the order of procedures proportional in number to the total number of branches. Therefore, the process becomes simple and time-saving without using a linear programming method.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 8 is a diagram of a node having a self-closed loop;

FIG. 9 is a diagram showing the flow of nodes by oriented arcs;

FIGS. 10(a)-10(b) are diagrams showing how to determine the weight of a node of pattern 5;

DETAILED DESCRIPTION OF THE PREFERRED EMBODIMENTS

Figure 5:
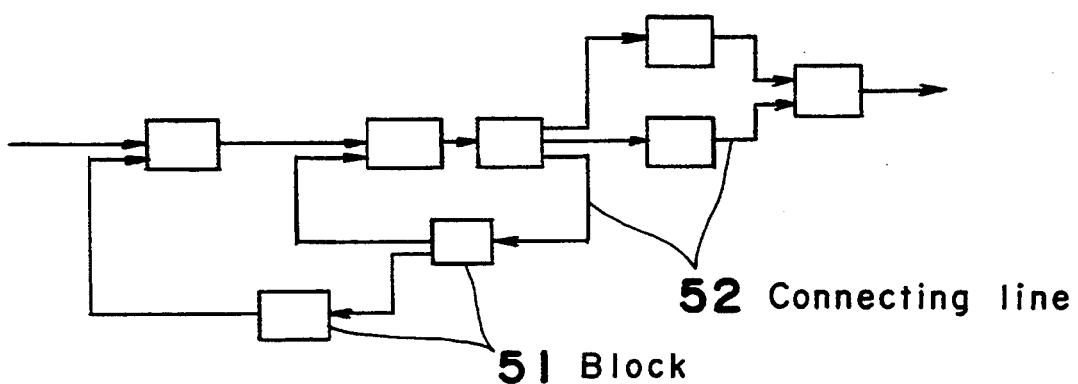
FIG. 5 is a block diagram of an object to be processed.

Before the description of the present invention proceeds a description follows of, a block diagram (FIG. 5) including loops employed for the description of the present invention. Referring to FIG. 5, elements 51 and 52 represent a block of an event and a connecting line between blocks 51 which expresses the transition from one event to the other, respectively. Therefore, in an example of a circuit diagram, the block 51 stands for a circuit element, and the connecting line 52 shows the flow of a signal. The present invention substantially handles such an object or event that can be represented by the aforementioned block diagram which can be converted to a strongly connected graph. However, a general block diagram is also acceptable if strongly connected components are extracted before application of the present invention. The above-mentioned strongly connected graph is an oriented graph always having one or more ways between two optional points in the graph. An algorithm to extract the strongly connected components is disclosed, for example, in "Basic Calculation" (1983), Iwanami Data Engineering 10, pp. 57–60 or the like, and the description thereof will be abbreviated here.

Figure 6:
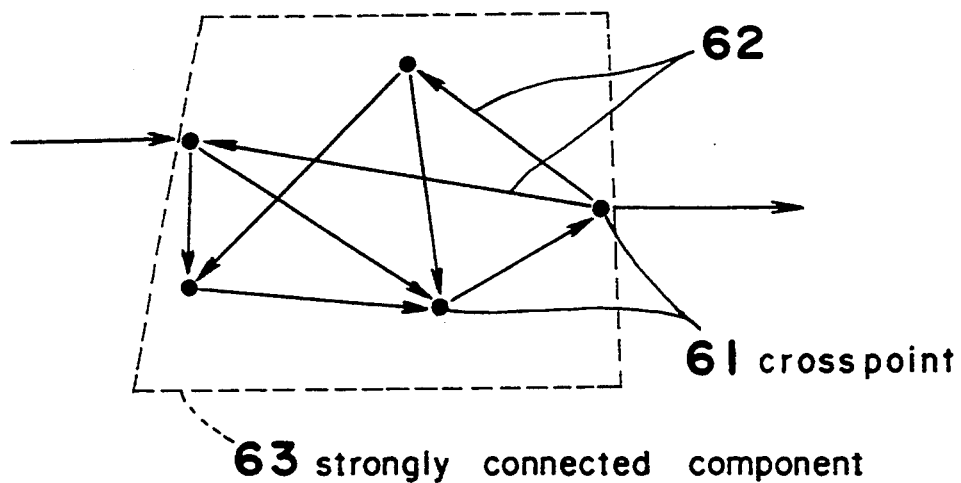
FIG. 6 is a diagram explanatory of the traffic network used in Embodiment 1.

In Embodiment 1, a road network such as indicated in FIG. 6 is employed. A junction or crosspoint 61 and a road 62 in FIG. 6 respectively correspond to the block 51 and connecting line 52 of FIG. 5. A car runs on a road in a direction of an arrow from one junction 61 to any other junction 61. The degree of congestion of the road 62 is detected on the assumption that the inflow and outflow of cars at each junction 61 are equal to each other, without any car coming in or out in the middle of the road 62.

FIG. 6 can be regarded as a strongly connected graph 63 consisting of nodes (junctions) 61 and arcs (roads) 62. The degree of congestion of the road may be expressed as the weight of the arc, and therefore it can be obtained by a process to obtain the weight of the arc.

Figure 4:
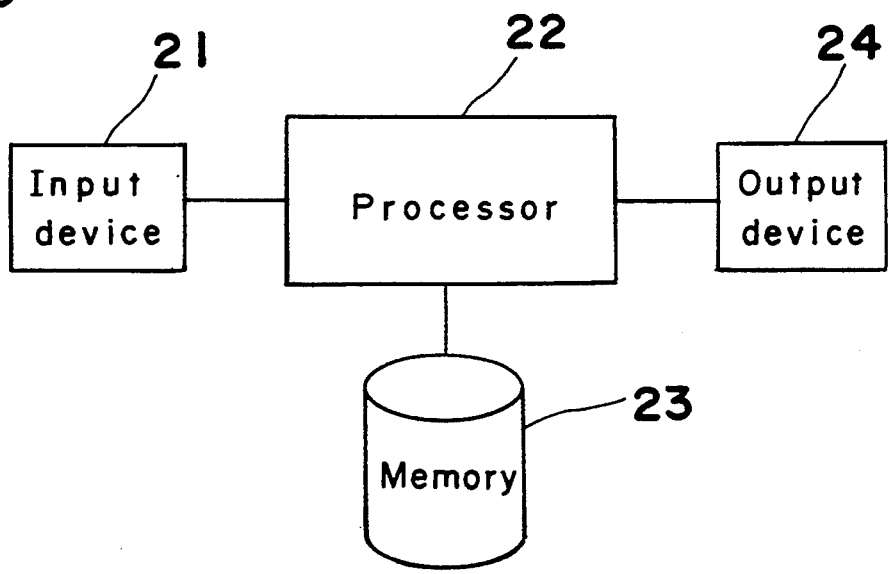
FIG. 4 is a schematic diagram of a system carrying out the analyzing process for resource allocation according to the present invention.

FIG. 4 schematically shows the structure of an apparatus for performing the above process, namely, obtaining the degree of congestion. A net list of junctions or roads in the road network is read from an input device 21 as a file, copied by a processor 22 for a work station and stored in a memory 23 connected to the processor 22 along with the original thereof. The net list indicates the connecting relationship of nodes and arcs. Each node has information of the arcs connected at an input side or an output side thereof as data, and each arc has information of the node connected at a source side or a sink side thereof.

The following three formulae are set as the condition to determine the weight of all of the arcs included in each loop of a strongly connected graph. That is, supposing that a set of nodes included in a strongly connected graph $G=(U,E)$ is U, a set of arcs is E, and a complementary set of the arcs is /E, and an arc from a node (i) to a node (j) at a node i, j (i, j∈U) is expressed by (i, j), and the weight of the arc is $x_{ij}$, $$x_{ij} \geq 1 \quad (i,j)\epsilon E$$
$$x_{ij} = 0 \quad (i,j)\epsilon /E$$

(No. 2)

At the node i,

-continued
$$\Sigma_j x_{ij} - \Sigma_j x_{ji} = 0 \quad (i,j)\epsilon E, (j,i)\epsilon E$$

(No. 3)

For an objective function, $$y \equiv \sum_{(i,j)} x_{ij} \rightarrow \min (i,j)\epsilon E$$

(No. 4)

(No. 2) indicates that the weight of all the arcs present in the graph is not smaller than 1, and the weight of the arcs not present in the graph is equal to 0. (No. 3) means that the inflow is equal to the outflow for the weight of the arcs at each node since the graph is a strong connection graph. (No. 4) means that the sum of the weight of all the arcs in the network should be as small as possible; in other words, the weight should be set as small as possible, thereby preventing the weight from becoming a large value to disperse in the case where the objective graph includes a loop.

Figure 1:
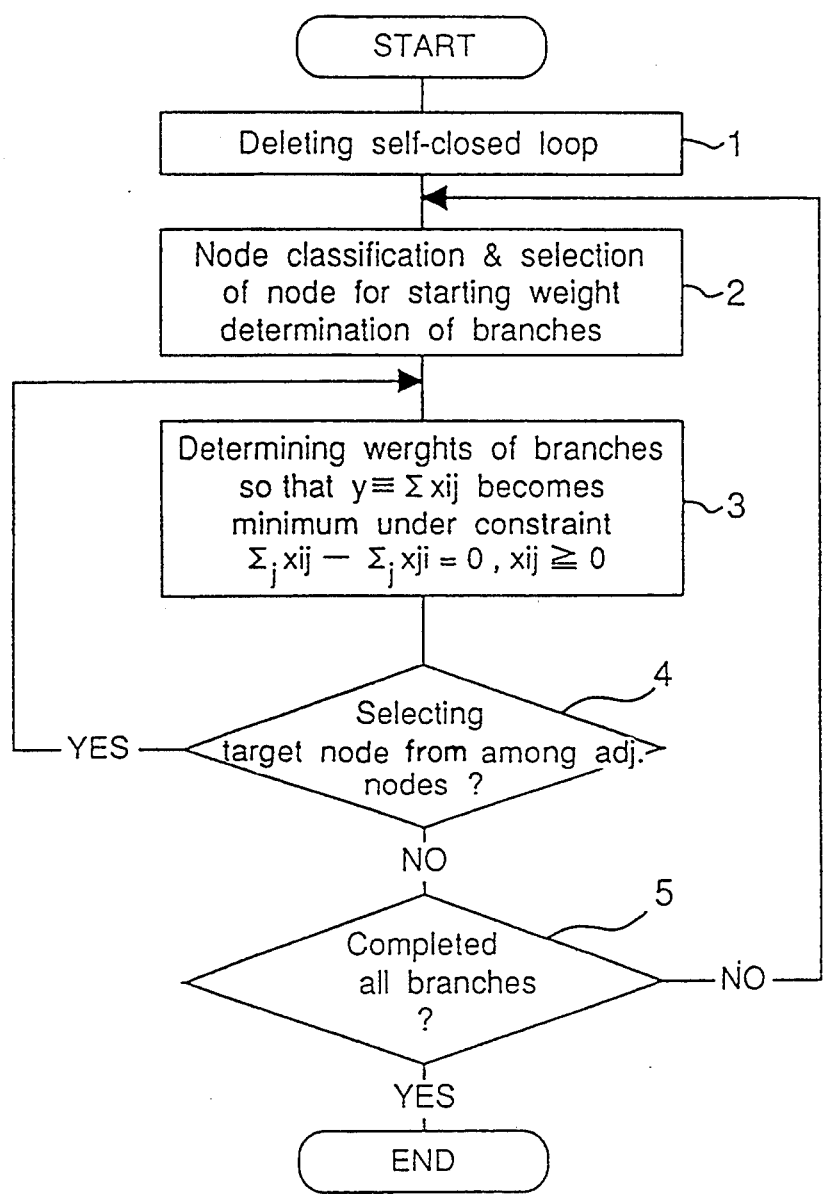
FIG. 1 is a flowchart of an analyzing process for resource allocation according to Embodiment 1 of the present invention.

The calculating method of the weight of all the arcs forming a loop in the graph using the above-described conditions will be discussed below with reference to the flowchart of FIG. 1.

For easy understanding of the description, nodes are classified into several patterns in accordance with the setting of the weight of an input arc to a node and an output arc from the node. It is to be noted here that the setting weight of the arc is a virtual value. Therefore, it is quite important to set the weight positively without an assumption, or as close to a true value as possible if based on an assumption. Moreover, it is also essential to raise the possibility of determination of the weight of the arcs of a next node by increasing the setting number of times of the weight of the arcs of one node, namely, setting number of virtual values. Nodes are classified in a manner as follows, with the above fact taken in consideration.

A node of a pattern 1 is a node having only one arc whose weight has not yet been determined, selected from among all of the arcs (input arcs+output arcs). The weight of this undetermined arc in the node of pattern 1 is determined to satisfy the abovenated equation No. 3, with the highest certainty. An example of the node of pattern 1 is indicated in FIG. 7 (a).

Figure 7A:
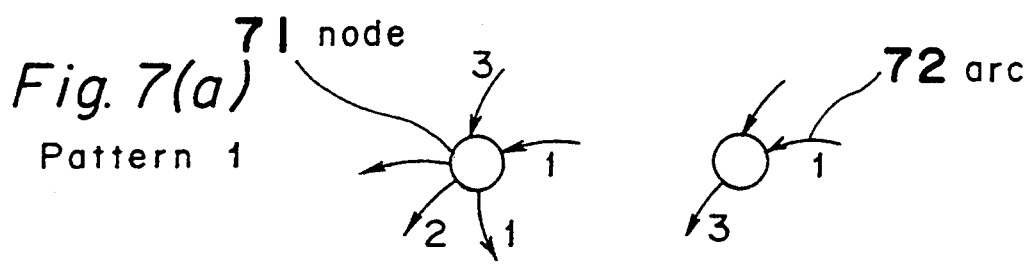
FIGS. 7(a)-7(e) are diagrams explanatory of classified patterns of nodes depending on the weight of arcs.
Figure 7B:
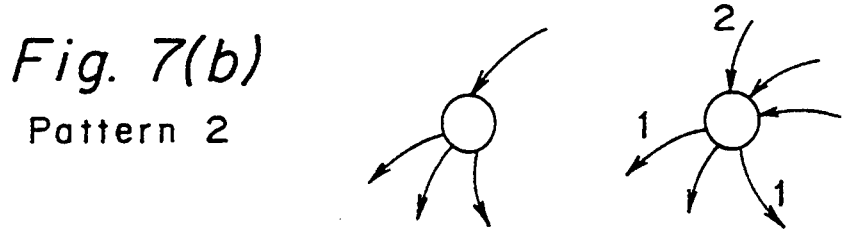

A node of a pattern 2 has one undetermined arc at one side and two or more undetermined arcs at the other side. Moreover, the total weight of the arcs at an input side whose weight has already been determined is equal to the total weight of the arcs at an output side whose weight has already been determined. In the node of pattern 2, the presumed weight is large and the weight of the undetermined arc at one side is assumed to be a large value. An example of this pattern of the node is shown in FIG. 7(b).

Figure 7C:
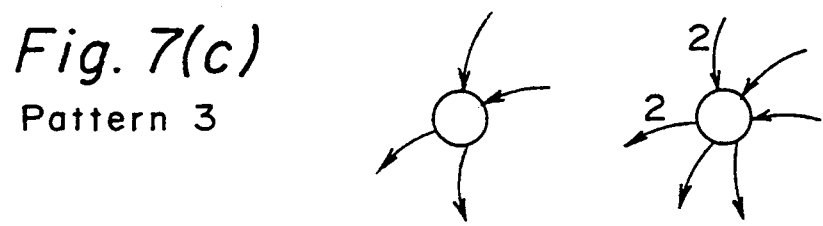

The number of undetermined arcs at an input side is the same as that at an output side in a node of a pattern 3. Moreover, the total weight of the already-determined arcs at the input side is equal to the total weight of the already-determined arcs at the output side. However, the number of undetermined arcs is not smaller than 2 both at the input side and at the output side. The node of pattern 3 is presumed to have a large weight. An example of the node is illustrated in FIG. 7(c).

Figure 7D:
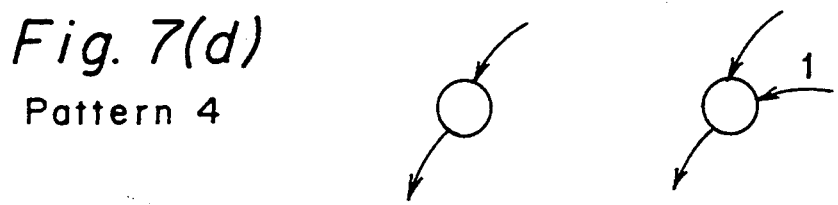

A node of a pattern 4 is a node which has one undetermined arc at an input side and one undetermined arc at an output side. Since the weight of the undetermined arc is easily determined from equation No. 3 if the weight of the other undetermined arc is determined in the node of pattern 4, the node has higher certainty than the nodes of patterns 2, and 3. However, the node of pattern 4 gives little influence with respect to the other nodes. An example is shown in FIG. 7(d).

Figure 7E:
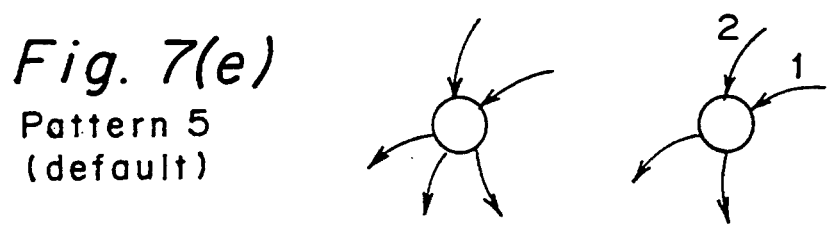

Nodes not belonging to any of the foregoing patterns are classified into a pattern 5 (default pattern), as in FIG. 7(e).

Now, a process to detect an arc having the maximum weight at a strongly connected part will be depicted with reference to the node patterns.

[Process 1] Removal of self-closed loop

In a process 1, an arc or arcs forming a self-closed loop is detected and removed from the graph. The self-closed loop is one such as that designated by numeral 81 in FIG. 8 that has an arc coming out of a node and returning again to the node.

[Process 2] Selection of start node

Figure 2:
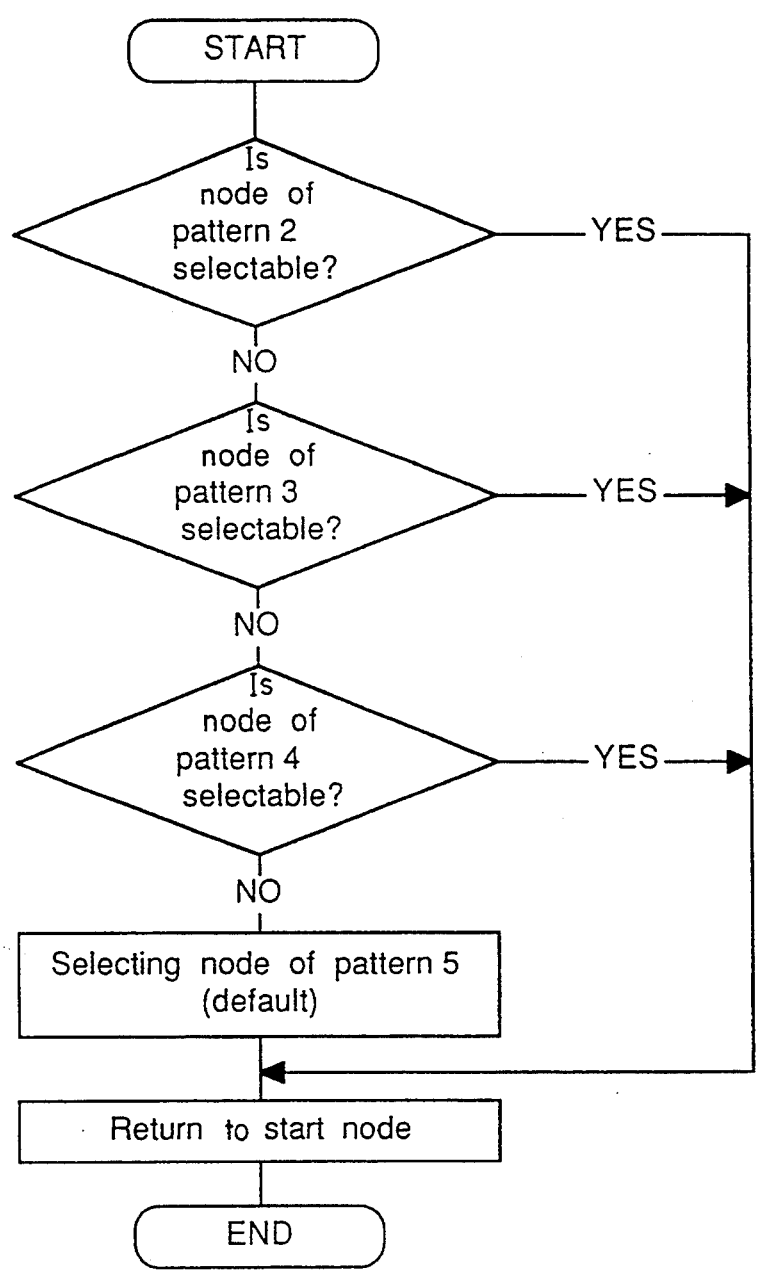
FIG. 2 is a flowchart of a selecting process of a start node.

A node from which to start the analysis (start node) is selected in a process 2. The flow of the process 2 is shown in FIG. 2. Since it is necessary to set an initial value of the virtual weight of an input/output arc of one node so as to determine the weight of all the arcs in the graph, the start node is selected to set the initial value in accordance with the priority preliminarily determined by the pattern of nodes. The priority is higher sequentially from patterns 2, 3, 4 to 5. If the start node is not detected in the nodes of pattern 2, it is searched in the nodes of pattern 3. If the start node is not found even among the nodes of pattern 5, the process to determine the weight is finished, thereby completing the whole process. The node of pattern 1 is not present when the process 2 is first carried out, nor selected as the start node in order to raise the possibility of determination of the weight of the other nodes when the process 2 is performed at the second time and thereafter.

The selecting process of the start node in each pattern of nodes will be carried out as follows.

In the case where the start node is selected from nodes of pattern 2, in the first place, a node having the largest difference in the number of undetermined arcs between at the input side and at the output side is detected. Thereafter, a node or nodes at the upper stream than the above-detected node is obtained from among the adjacent nodes connected to the node by arcs. The node at the upper stream is not only a node from which the arcs start, but a node to be first taken into consideration to satisfy equation No. 3 and equation No. 4 in determining the weight of the arcs. Referring to FIG. 9, a node A is upstream from a node B. Therefore, when no node exists upstream from among the adjacent nodes, that is, when the uppermost node is found, the node is determined to be the start node.

When the start node is to be selected from nodes of pattern 3, if the total weight of the already-determined arcs is equal to each other at the input side and output side, a node having the largest number of undetermined arcs at the input side (or at the output side) is selected. If the weight of the already-determined arcs are all 1, a node of the largest total number of arcs at the input side (or at the output side) is selected as the start node.

In order to select the start node from the nodes of pattern 4, a node having the largest difference in the total weight of the already-determined arcs between the input and output sides is selected.

If it is impossible to select the start node from any of the nodes of patterns 2, 3, 4, the start node is selected from the nodes of pattern 5. The selecting method is the same as in the case of pattern 4, that is, a node with the largest difference in the total weight of the already-determined arcs between the input and output sides is selected.

It is so arranged as a countermeasure against an infinite loop wherein the weight cannot be determined for the selected node that; if there is an element in a set of nodes whose weight cannot be determined in a process 3, these nodes are not selected as the start node.

An experimental method or the other classifying method may be employed instead of the method of FIG. 2 to select the start node.

[Process 3] Determination of the weight of the arc

The weight of each arc of the node selected in processes 2 and 4 is determined in a process 3. The method is made different for every pattern of nodes, but the weight of the input/output arc is determined so that equation No. 3 and equation No. 4 are satisfied in any case. The procedure will be discussed below for every pattern.

Since there is one arc whose weight is not determined in the node of pattern 1, the weight of the arc can be determined solely from equation No. 3.

In the nodes of pattern 2, 1 is added to each of a plurality of the undetermined arcs at the input side or output side. The weight of the undetermined arc at the other side is obtained from equation No. 3.

In the nodes of pattern 3, 1 is set as the weight of each of the undetermined arcs.

In the nodes of pattern 4, the weight of the undetermined arcs at the side having the smaller total weight of the already-determined arcs is determined to be 1. The weight for the undetermined arcs at the other side is set according to equation No. 3.

The weight of each of the undetermined arcs is set as small as possible for the nodes of pattern 5, giving greater importance to equation No. 4. More specifically, the weight of the undetermined arcs are all supposed to be 1, and then a comparison of equation No. 5 is conducted between the input side and the output side. Given that the number of undetermined arcs at the input side is $N_A$, the number of undetermined arcs at the output side is $N_B$, a set of arcs at the input side is A (A E), and a set of arcs at the output side is B (B E), then $$N_A + \sum_A x_{ij} = N_B + \sum_B x_{ij} \tag{No. 5}$$

In the foregoing equation, the weight of the not undetermined arcs of a larger value are all set to be 1.

Figure 11A:
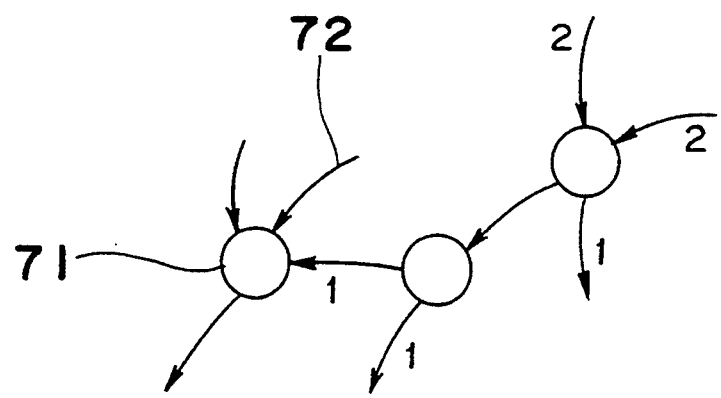
FIGS. 11(a)-11(b) are diagrams showing how to make a preliminary decision when 1 is added as the weight and how to determine the weight.
Figure 11B:
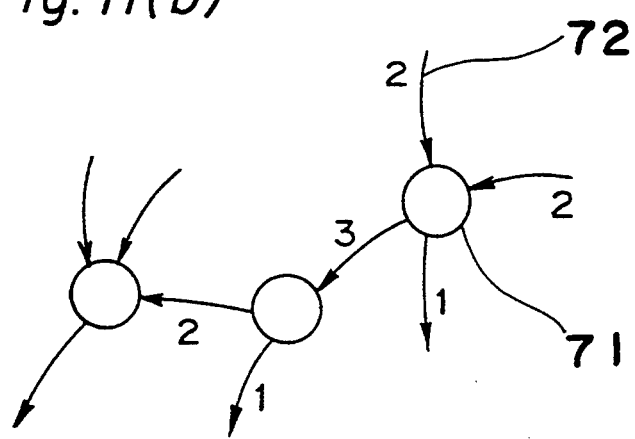

Then, the weight of the undetermined arcs of a smaller value is make as small as possible to satisfy equation No. 3. An example how to determine the weight of the arcs in the node of pattern 5 is indicated in FIGS. 10(a)–10(b), FIG. 10(a) showing the state of the node before the weight of the arcs has been determined, while FIG. 10(b) showing the state of the node after the weight has been determined. In this procedure, special attention should be given to the case where the weight of 1 is to be set to the arcs of patterns 2, 3, 4, 5 since it is impossible to set 1 if the weight is sure to be larger than 1 from the flow of the signal. Therefore, it is necessary to check beforehand if 1 is to be given for the weight. That is, it should be checked whether a degree of freedom which is enough to satisfy equation No. 3 remains if the weight for the adjacent node connected by the objective arc is set to 1. In this case, if the adjacent node is of pattern 4, the result cannot be obtained from the adjacent node alone. Therefore, another adjacent node connected to the other undetermined arc should be checked. At the same time, if 1 is impossible for the weight, a correct value of the weight is obtained. The above procedure is repeatedly fed back until the result is obtained and, 1 is set as the weight if it is possible. If it is impossible, the resultant correct value is determined as the weight. FIGS. 11(a) and 11(b) respectively show when the weight is supposed to be 1 and when the weight is set.

In the case where the node belongs to pattern 3, even if the correct value of the weight is fed back, it is impossible to determine the weight of the other arcs from the processing viewpoint. In such case, after the correct weight is given to the undetermined arc, the determination of the weight in the node is terminated.

Figure 12:
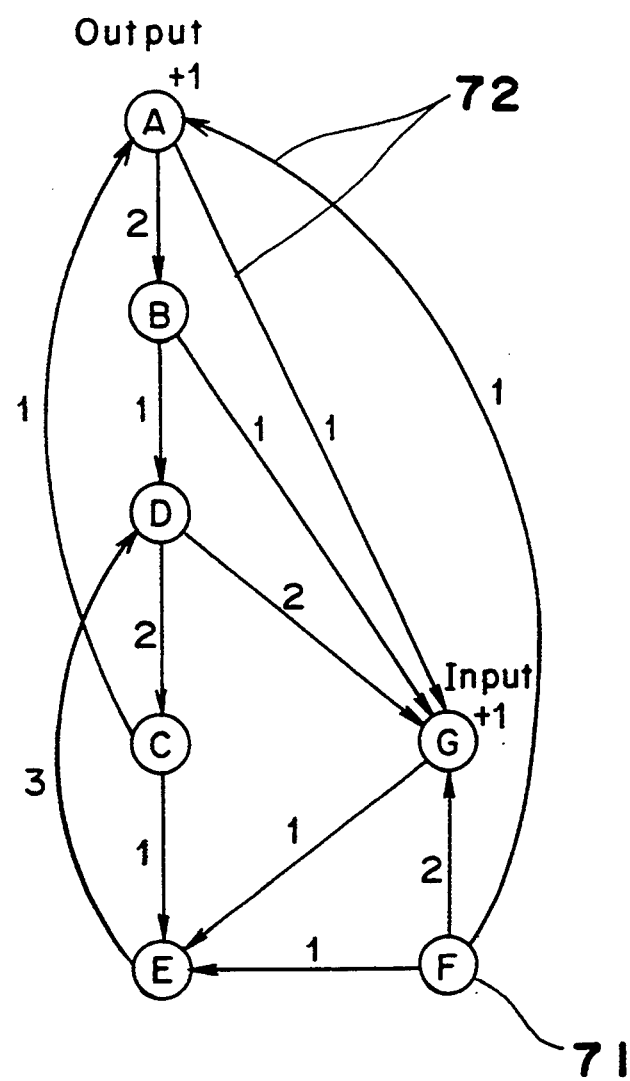
FIG. 12 is a diagram of an example of an error node.

Moreover, if equation No. 3 is not satisfied by the original node when the correct value is fed back, the weight is determined to be 1. However, this procedure might possibly bring about a node not satisfying equation No. 3. Such an error node as above is found, if any, plural and, the total weight of the input arcs at each node in the whole graph is equal to the total weight of the output arcs at the node, and therefore, the increment and decrement of the weight for all of the error nodes is summed up to 0 according to equation No. 3. For example, when the total weight of the input arcs at one node is 2 larger than the total weight of the output arcs, the total weight of the output arcs at another node is 2 larger than the total weight of the input arcs. Therefore, it is possible to return the error node to a normal one by extracting a loop passing through all of the error nodes and adjusting the increment and decrement of the error nodes for the arcs constituting the loop (referring to FIG. 12).

When the weight is determined for all of the arcs, if the node does not satisfy equation No. 3, the node is added as an element to a set of nodes whose weight cannot be determined. In contrast, if equation No. 3 is found satisfactory, there is generated a possibility that a fresh weight is determined even if the above set of nodes already contains the element, and therefore the set is removed.

[Process 4] Determination of next node

Figure 3:
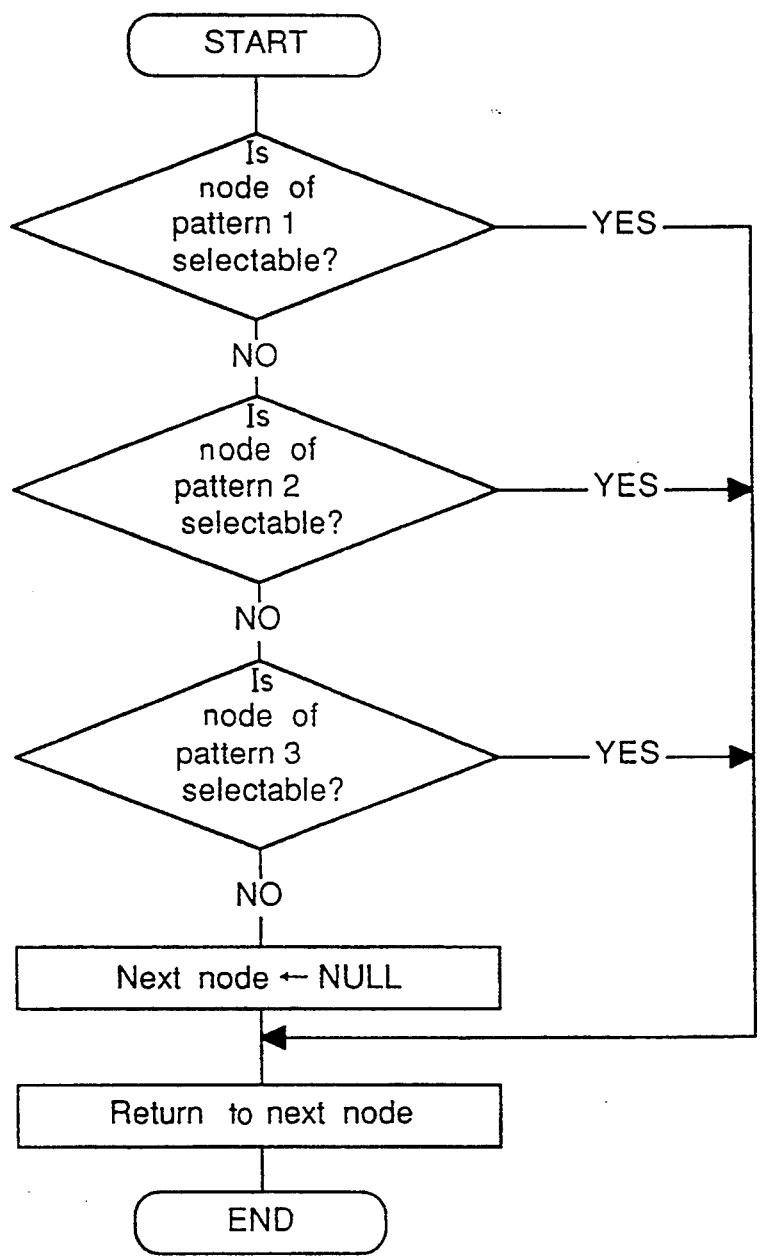
FIG. 3 is a flowchart of a selecting process of a next node.

In a process 4, a node to determine the weight of the next arcs (next node) is selected. The process 4 is shown in a flowchart of FIG. 3. The next node is selected from among the adjacent nodes to the node subjected to the process 3. Since there are a plurality of adjacent nodes, the next node is determined by the pattern. The selecting priority is in the order from patterns 1 to 2 to 3. If there is a node of pattern 1 among the adjacent nodes, the node of pattern 1 is selected as the next node, and so on. Without a node of pattern 3, the process 4 is finished.

Figure 13:
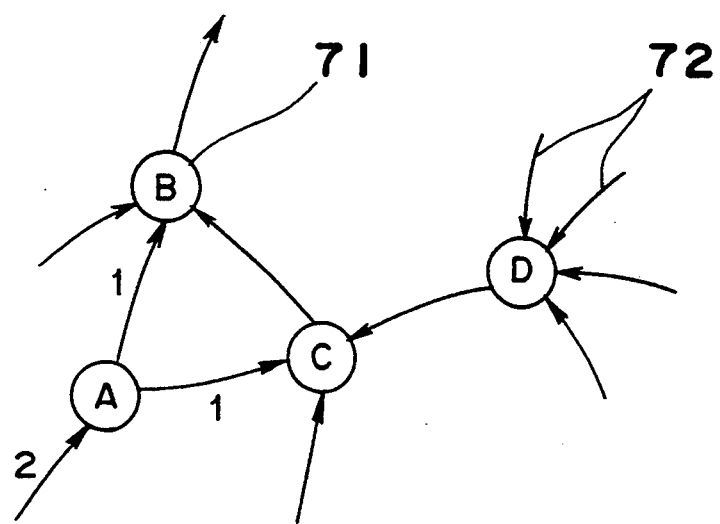
FIG. 13 is a diagram of how to select a next node when the parent-child relationship is present.

Although a node of pattern 2 is selected if a node of pattern 1 is not present, if there are a plurality of nodes of pattern 2 among the adjacent nodes and the nodes of pattern 2 are adjoining to each other, an upstream node is called a parent node, and a downstream node is called a child node, thereby forming a parent-child relationship. When there are nodes of the parent-child relationship among the adjacent nodes, the parent node is selected as the next node. Further, if there is an upstream node which is more upstream than the parent node, the node upstream is selected as the next node, similar to the process 2. FIG. 13 shows an example when the next node is selected in the case of the parent-child relationship. In the example of FIG. 13, the next node is selected from the adjacent nodes after the weight of the node A is determined. A node C is first selected since it is a parent node of a node B, and then a node D is selected since it is a node upstream from than the node C. Accordingly, the node D is eventually selected as the next node.

If there is no node of pattern 2 in the above procedure, a node of pattern 3 is selected from the adjacent nodes. In the case where a plurality of nodes of pattern 3 are present, a node of the largest number of undetermined arcs is selected. If there is not even a node of pattern 3, a next node cannot be obtained from the adjacent nodes.

When the next node for determination of the weight is selected among the adjacent nodes, the process 3 is returned to determine the weight. Otherwise, a process 5 follows.

[Process 5] Decision of completion of determination of weight of all of the arcs When it has been is detected that the weight of all of the arcs in the graph have been determined, the process is considered to be completed. If the weight has not yet been determined for all of the arcs, the process 2 is returned to select a fresh start node from the graph.

Referring to FIG. 4, data to be processed is read out from a net list within the memory 23 into the processor 22, where processes 1–5 are carried out. The patterns of nodes detected in the processes are preserved in each node as data and the determined weight of each arc is preserved in each arc as data. Moreover, an error flag is set by the error node as data within the node. When the weight of all of the arcs in the net list is determined in the process 5, the weight is output as the result of resource allocation from an output device 24.

Figure 14:
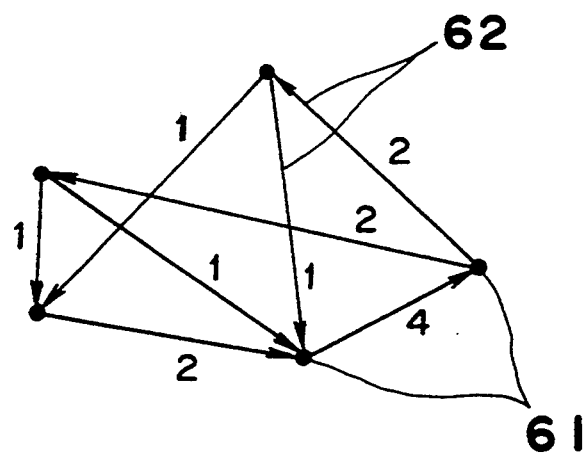
FIG. 14 is a diagram showing the degree of congestion (strongly connected parts alone) in a road network of Embodiment 1.

The output result is shown in FIG. 14. The weight of the arcs represents the degree of congestion in the road 62. The road 62 with the larger weight is assumed to be much more congested and traffic lanes may be increased for the road 62.

Figure 16:
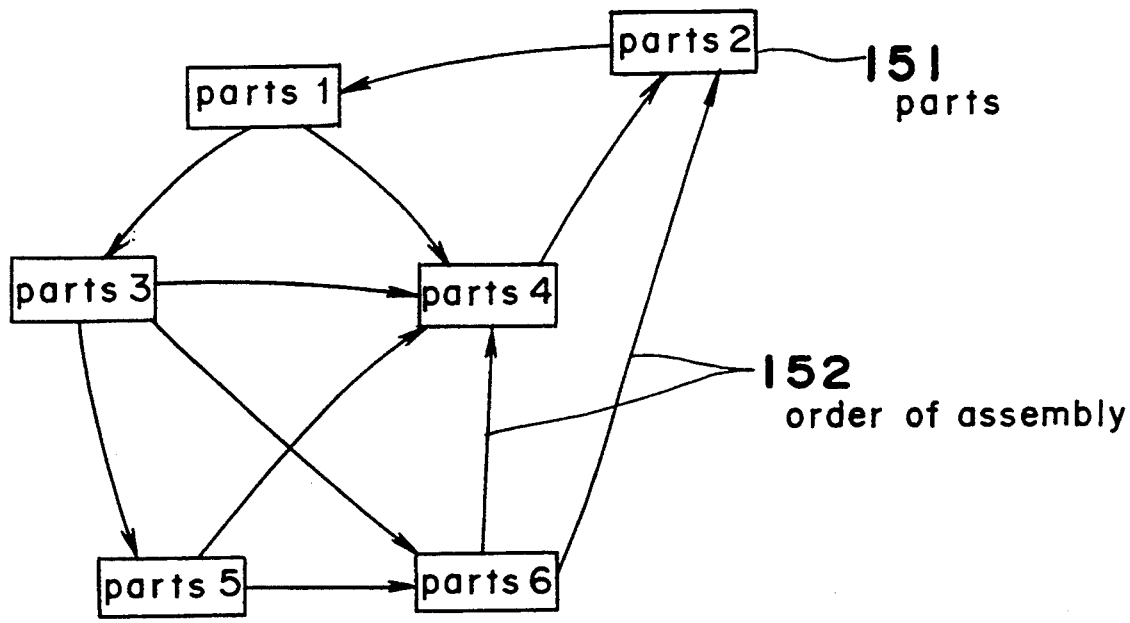
FIG. 16 is a diagram showing the assembling order of components according to Embodiment 2.

Embodiment 2 relates to the determination of the assembling order of components of an apparatus. The apparatus is constituted wiring connecting the components. The assembling order 152 of a component 151 is, for example, as shown in FIG. 16. When the relationship among the components defines loops as indicated in FIG. 16, the assembling order may be determined with the assembling efficiency taken into consideration, i.e., by reducing the number of parts as much as possible where the flows in the loop are fed back. Therefore, a part where arrows 152 representing the flows or relationship among the components gather most is searched for and selected as a feedback. An arrow of the feedback is detected and the components constituting the loop are arranged in order.

According to the instant embodiment, the component 151 and assembling relationship 152 in FIG. 16 correspond to the block 51 and connecting line 52 of FIG. 5 and, an apparatus to determine the assembling order of all of the components is illustrated in FIG. 4. Each part of the apparatus in FIG. 4 according to Embodiment 2 works the same function as in Embodiment 1.

Figure 15:
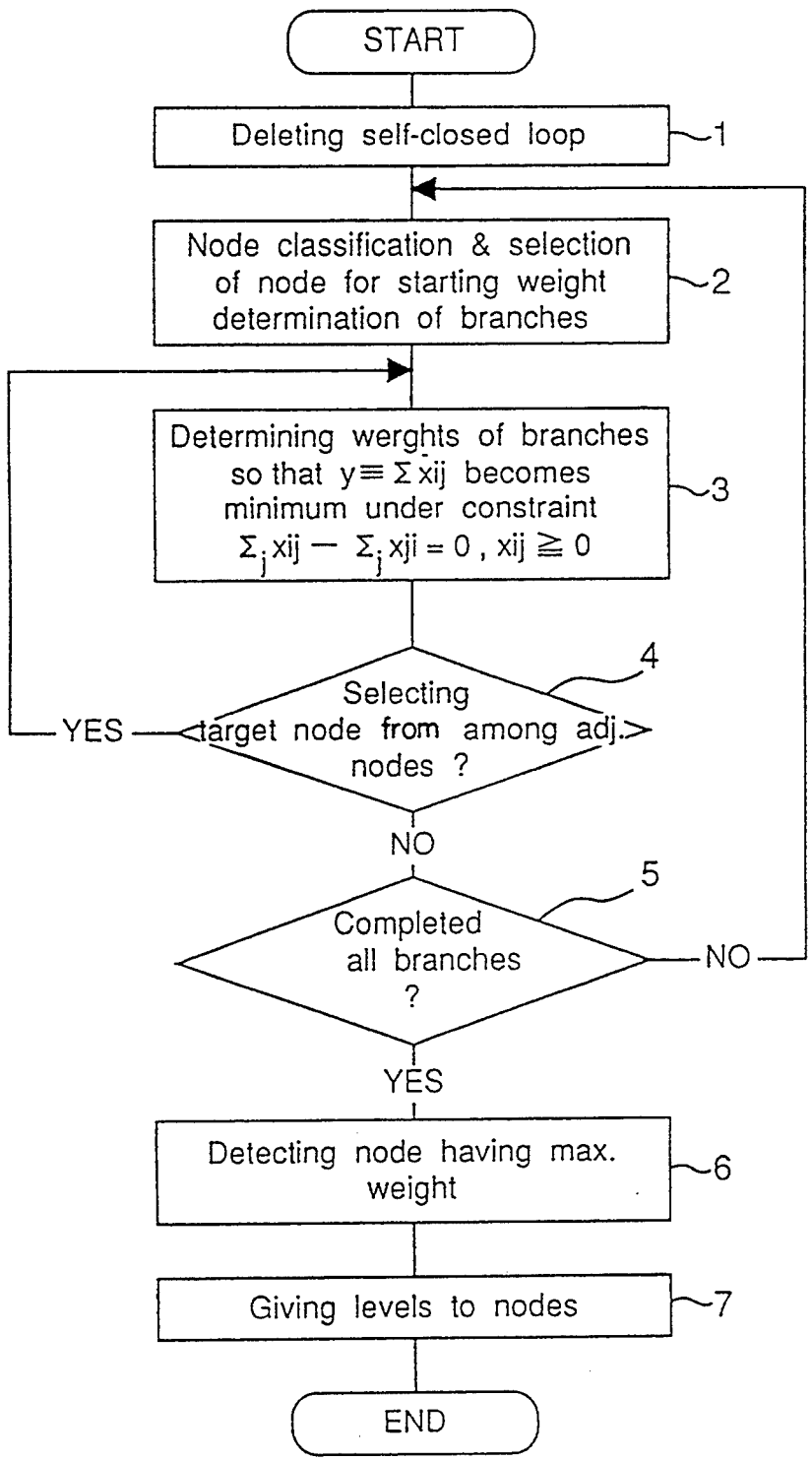
FIG. 15 is a flowchart of a scheduling process according to Embodiment 2 of the present invention.

Embodiment 2 is constituted by nodes (blocks) and arcs (connecting lines) in the form of a graph including strongly connected components. The weight of the arc represents the priority of the assembling order. A graph of only strongly connected components obtained by removing not strongly connected components from a strongly connected graph is processed in accordance with the flowchart of FIG. 15. Since processes 1–5 in FIG. 15 are equivalent to those in the resource allocation of Embodiment 1, the processes 1–5 are treated in the same fashion as in Embodiment 1 and the following description will be directed to a process 6 and thereafter.

[Process 6] Detection of arc with the maximum weight

Figure 17:
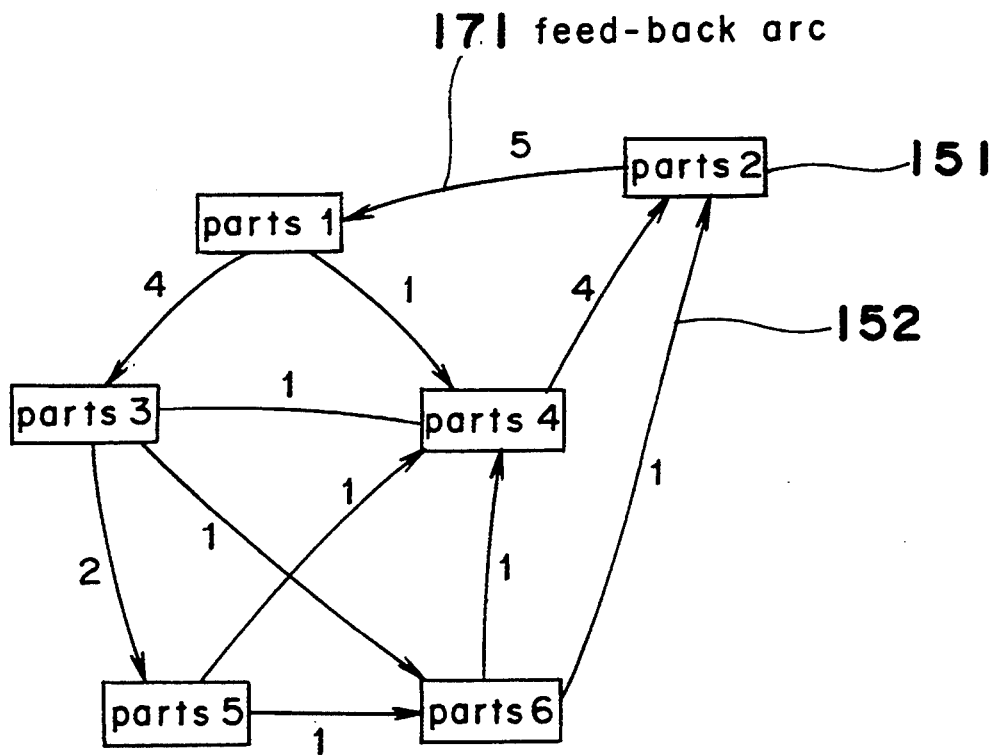
FIG. 17 is a diagram showing the assembling priority of components in Embodiment 2.

When the weight of all the arcs is determined, the respective weight is preserved in each arc as data. The values of the weight are compared to detect the maximum weight and an arc with the maximum weight in a process 6. The arc with the maximum weight becomes a feedback arc of a loop including the arcs. FIG. 17 shows the state where the weight is determined for each arc of FIG. 16. From FIG. 17, the arc having the maximum weight from a component 2 to a component 1 is rendered a feedback arc 171.

Figure 18:
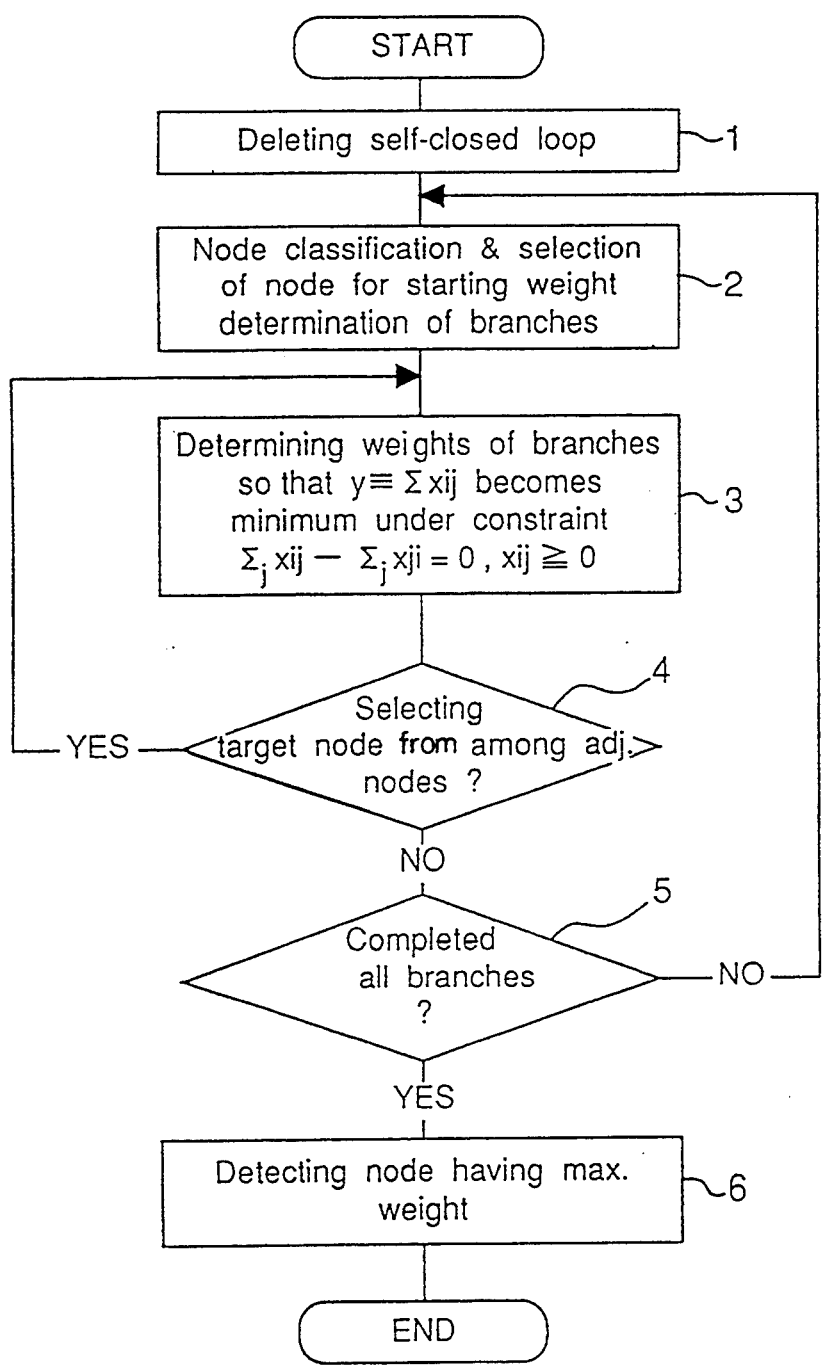
FIG. 18 is a flowchart of an analyzing process of the maximum flow in Embodiment 2.

As is shown in a flowchart of FIG. 18, when the maximum weight and the arc with the maximum weight are output upon completion of the whole procedure in the process 6, the maximum flow in the network is to be analyzed.

[Process 7] Ordering of nodes in loop

As a result of the process 6, each node constituting the loop including the feedback arc is allotted an ordinal number. The ordinal number is sequentially allotted from a node at the sink side of the feedback arc in an arrow direction of the arcs. In FIG. 17, since the wiring from the component 2 to the component 1 is selected as the feedback arc 171, the assembling order of the components is determined in a direction of the wiring from the component 1.

The above process will be explained with reference to FIG. 4. The data to be processed is taken out from a net list within the memory 23 into the processor 22, where the processes 1–6 are carried out. Allotting of the ordinal numbers in the process 7 is performed for the original net list input from the input device 21. Accordingly, the order of the feedback arc and nodes is output from the output device 24.

Figure 19:
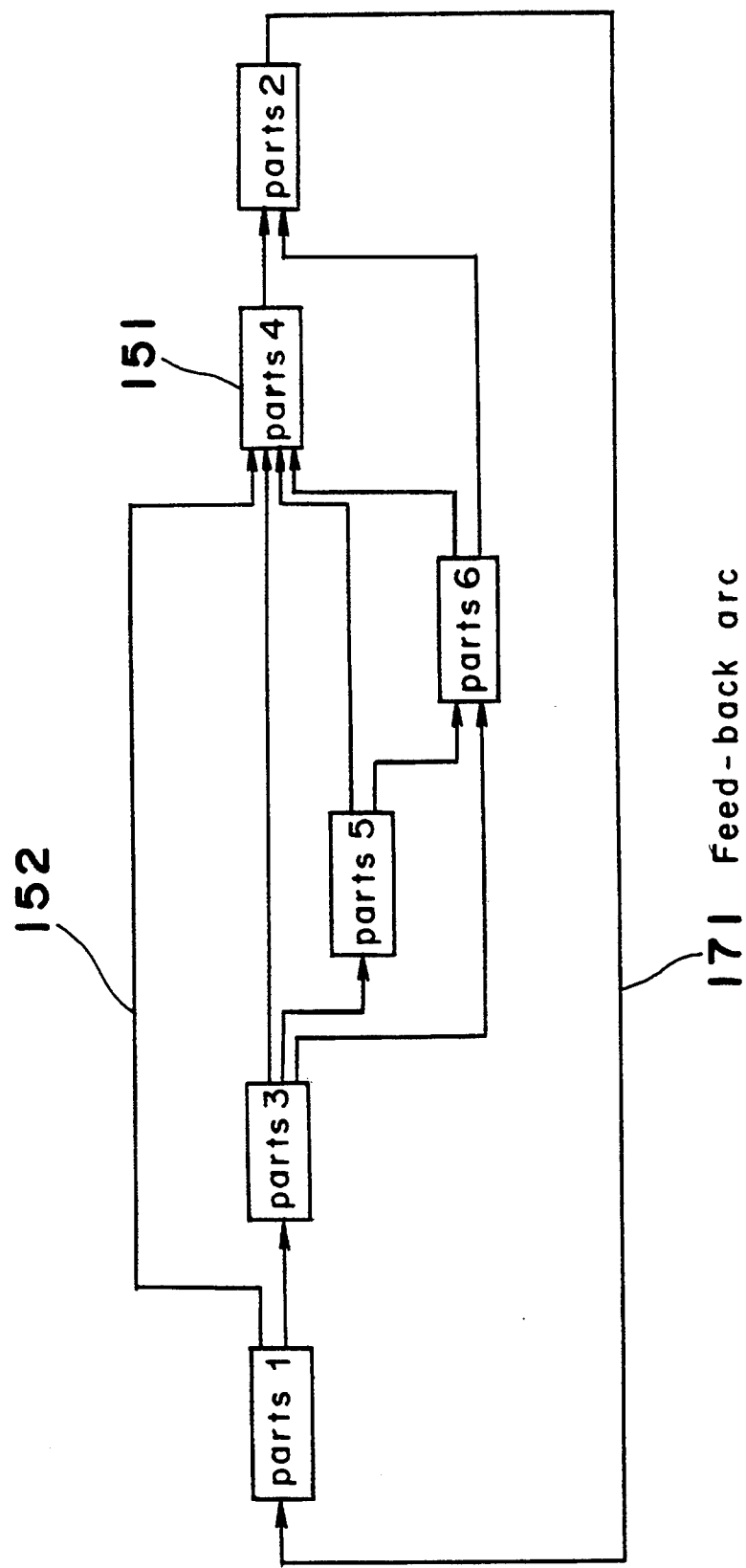
FIG. 19 is a diagram of the whole assembling process of components in Embodiment 2.

If each component is rearranged according to the result of the foregoing process 7, FIG. 17 is changed to FIG. 19. Thus, the apparatus can be assembled with highest efficiency.

Embodiment 3 handles selection of a feedback signal line to arrange logic gates in a lateral direction of a logic diagram. Data of the logic diagram is considered as a net list representing the connecting relationship of logic gates with signal lines between the logic gates. When the signal lines form a loop, the number of feedback lines should be made as small as possible for the convenience of easy understanding of the logic diagram. Therefore, a signal line having the largest degree of duplication of signal lines is selected as the feedback line. Moreover, selecting the feedback line makes it possible to determine the arranging order of logic gates of the loop.

Figure 20:
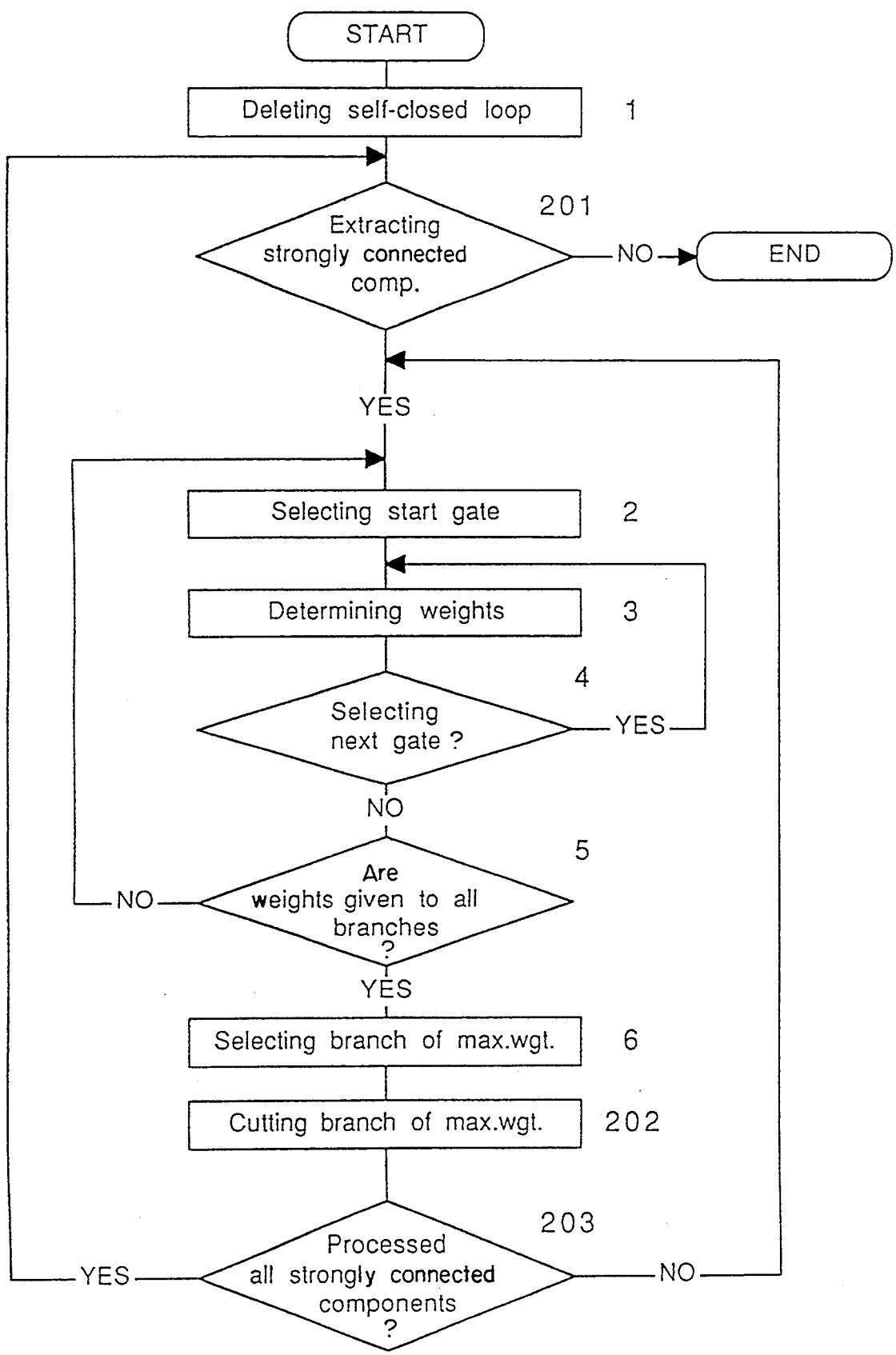
FIG. 20 is a flowchart of a process according to Embodiment 3 of the present invention.
Figure 21:
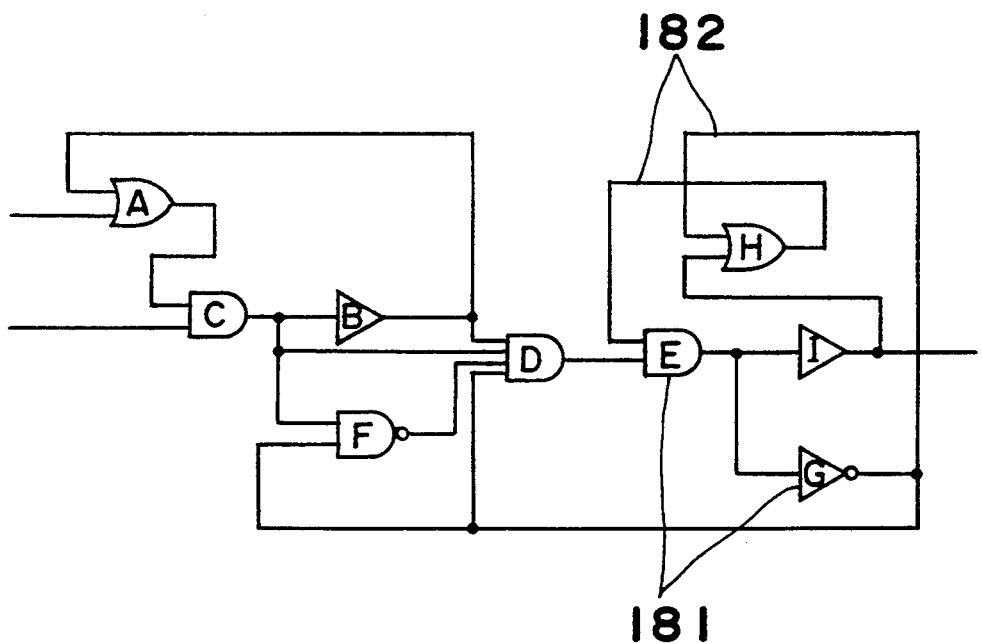
FIG. 21 is a diagram of logical circuits of Embodiment 3.
Figure 22:
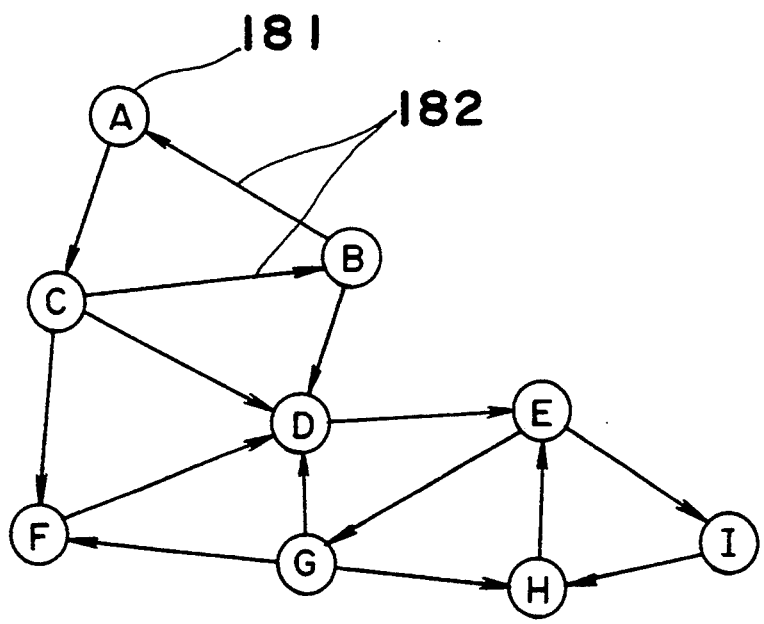
FIG. 22 is a diagram showing the connecting relationship of logic gates and signal lines in FIG. 21.

A logic circuit used in the present Embodiment 3 is shown in FIG. 21. The connecting relationship between the logic gates and signal lines of FIG. 21 is indicated in FIG. 22. In this case as well, the logic circuit can be expressed as a block diagram. A logic gate 181 and a signal line 182 in FIGS. 21 and 22 are equivalent to the block 51 and connecting line 52 in FIG. 5. When the logic gates and signal lines in FIG. 22 are respectively replaced by nodes and arcs, the obtained graph is schematically processed in accordance with the flowchart of FIG. 20. The weight of the arc shows the degree of duplication of the signal line. A processing apparatus for Embodiment 3 is shown in FIG. 4. Each part in FIG. 4 operates in the same manner as in Embodiments 1 and 2.

The processing flow will be described with reference to FIG. 20.

Figure 23A:
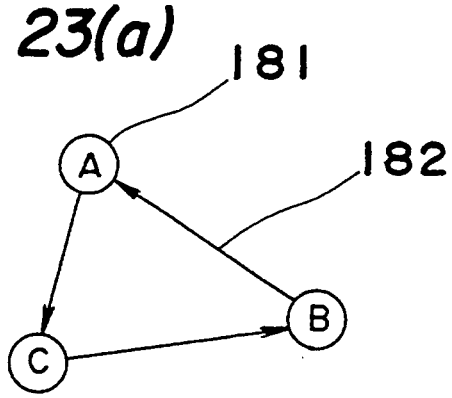
FIGS. 23(a) and 23(b) are diagrams of strongly connected components (a) and (b) included in FIG. 22.
Figure 23B:
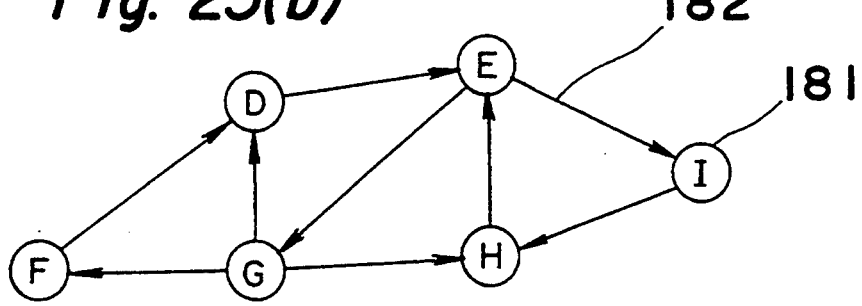

In a process 1 of FIG. 20, a self-closed loop is searched and removed. When the signal lines form a loop in the logical circuit, only the loops in which the logic gates are difficult to be arranged are taken out from the graph, so that the logic gates constituting the loop are rearranged. This is a process 201 to extract strongly connected components. As the loop becomes complicated, it is hard to obtain the weight of all the signal lines through one process. Therefore, a signal line having the maximum weight is detected and cut, and then the extraction process is performed again. If even a single strongly connected component is not detected in the extraction process, it is so regarded that the graph does not contain a loop, and the above procedure is repeated until it becomes impossible to extract the strongly connected component. The strongly connected components (a) and (b) resulting from FIG. 22 after the extraction process are shown in FIGS. 23(a) and 23(b), respectively. The signal lines between different strongly connected components are cut.

A signal line having the maximum weight is detected for one strongly connected component. The procedure from the selection of a start node to the detection of an arc having the maximum weight is carried out in the same manner as in processes 2, 3, 4, 5, 6 of Embodiments 1 and 2.

The signal line having the maximum weight which is detected in the process 6 is cut in a process 202 and stored as data. The loop including the signal line is cut by cutting the signal line, so that the objective strongly connected component is decomposed.

Figure 24:
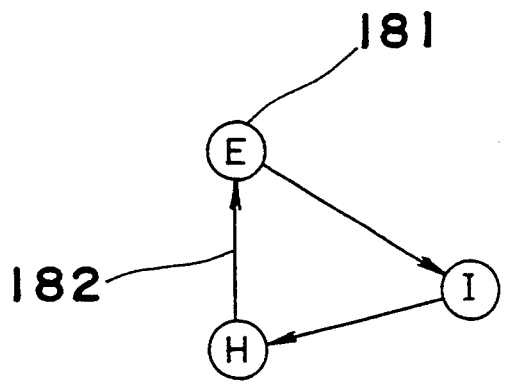
FIG. 24 is a diagram of a strongly connected component (c)

After the process 202, a determination is made in a process 203 as to whether or not a strongly connected component for which the process to search for the signal line with the maximum weight is not finished is present. If an unprocessed strongly connected component remains, processes from 2 to 203 are repeated. If there is no unprocessed strongly connected component, the extraction process 201 is performed again. At this time, since it is after the signal line having the maximum weight has been cut, a strongly connected component having a larger number of nodes (logic gates) than the earlier obtained strongly connected component is never obtained. A signal line having the maximum weight from a logic gate E to a logic gate G in the strongly connected component (b) of FIG. 23(b) is cut, and the extraction process is carried out again. As a result, a strongly connected component (c) as shown in FIG. 24 is obtained. When the strongly connected component is detected, the above-described sequence of processes is repeated for the detected strongly connected component.

Figure 25A:
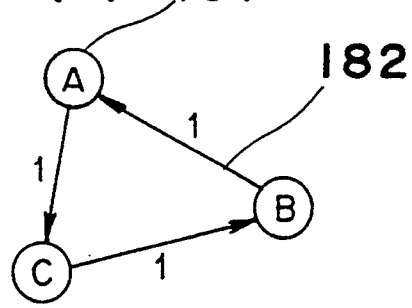
FIGS. 25(a)-25(c) are diagrams of the degree of duplication of signal lines of each strongly connected component.
Figure 25B:
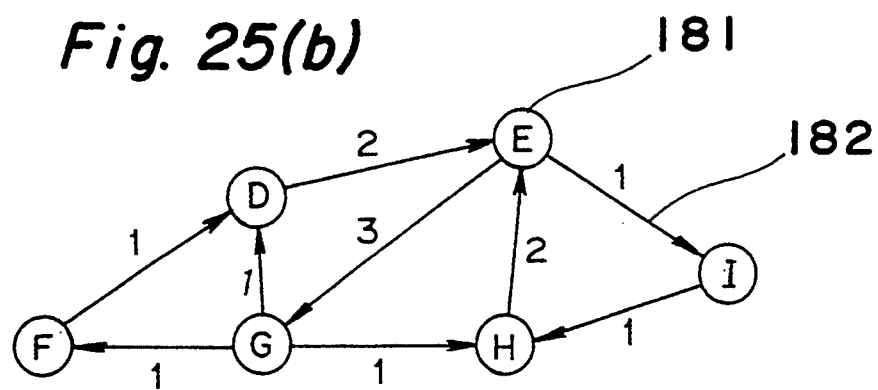
Figure 25C:
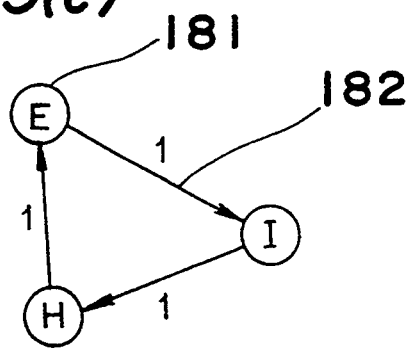
Figure 26:
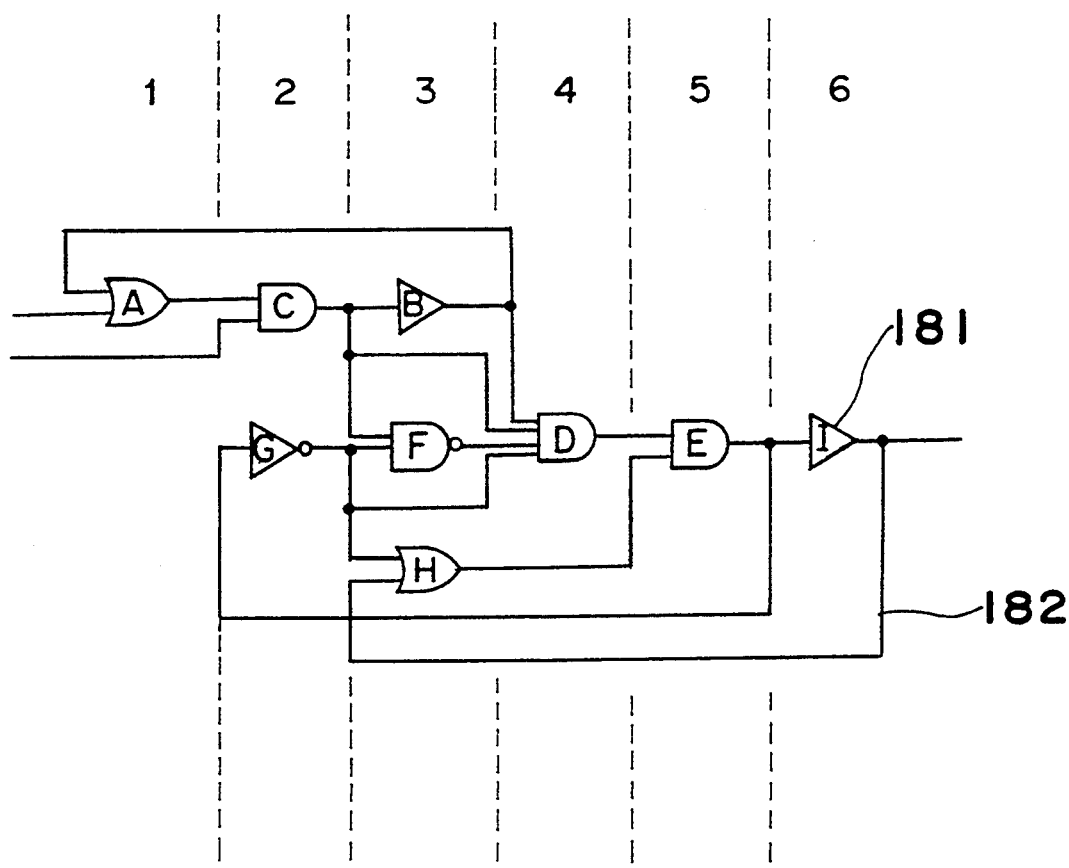
FIG. 26 is a diagram when the logic gates of FIG. 21 are arranged in a lateral direction.

If a strongly connected component is not detected in the process 201, it is so judged that there is no loop within the graph, whereby the process is completed. The weight of strongly connected components (a), (b), (c) of FIGS. 23 and 24 is indicated in FIGS. 25(a), 25(b), 25(c), respectively. From FIGS. 25(a)–25(c), a signal line from a logic gate B to a logic gate A, a signal line from logic gates E to G and a signal line from logic gates I to H are selected as feedback signal lines of the strongly connected components (a), (b), (c), respectively. However, if the weight of the signal lines is all 1 as in the strongly connected component (a) or (b), any signal line may be selected as the feedback signal line. The arranging result of the logic gates of the logical circuit of FIG. 21 in the lateral direction is shown in FIG. 26.

Although the logical circuit is an object to be processed in Embodiment 3, if the object is a circuit of the functional level, the circuit can be processed similarly as a functional diagram.

As is fully described hereinabove, according to the present invention, problems can be processed and analyzed in a simple manner in a short time through detection of the weight of each branch of a network without using a linear programming method.

A strongly connected graph is used for a model of the network, and the status for resource allocation and the status transition are replaced by nodes and branches in the graph. Therefore, resource allocation can be analyzed easily.

Moreover, the maximum flow in the network can be detected according to the present invention by finding a branch with the maximum weight.

Further, when the nodes and branches are replaced by the working content and working flow in the strong connection graph, and if a process whereby a branch with the maximum weight is removed so as to thereby cut a closed loop is added when the maximum flow is analyzed, it becomes possible to analyze scheduling of all of the nodes in the graph, that is, to arrange the working content in order.

A1 though the present invention has been fully described in connection with the preferred embodiments thereof with reference to the accompanying drawings, it is to be noted that various changes and modifications are apparent to those skilled in the art. Such changes and modifications are to be understood as being included within the scope of the present invention as defined by the appended claims unless they depart therefrom.

What is claimed is:

1. A method of analyzing resource allocation to a linear programming model of a graph consisting of nodes representing the status and branches representing the status transition and including at least one closed loop, which comprises:
   a step 1 of classifying all nodes contained in said graph into patterns, each having a given priority, based on a state of weights given to input and output branches of each node;
   a step 2 of selecting a node i from which to start a determination of the weight to each branch from among all of nodes in the graph based on results of classification in step 1;
   a step 3 of weighting all of input branches and output branches of the selected node i so that $y \equiv \Sigma_j X_{ji} + \Sigma_j X_{ij}$ is minimized under a constraint represented by the following equation (1):

$$\Sigma_j X_{ij} - \Sigma_j X_{ji} = 0$$

$$X_{ij} \geq 0$$

wherein $X_{ji}$ is a weight of an input branch from node j to node 1 and $X_{ij}$ is a weight of an output branch from node i to node j;

a step 4 of selecting a node of which input and output branches are to be weighted next time based on a state obtained by executing step 3;
   a step 5 of determining weights of all input and output branches in accordance with a method corresponding to that of step 3; and
   a step 6 of repeating steps 4 and 5 to determine weights of input and output branches for remaining nodes.

2. A method of analyzing resource allocation according to claim 1, whereby said step 4 includes a process of selecting a next node to be an object for a next determination of the weight from among the adjacent nodes connected by branches to the earlier processed node.

3. A method of analyzing resource allocation according to claims 1 or 2, whereby strongly connected components are extracted from said graph, so that all of the branches in a graph of a model obtained by removing self-closed loops from one or a plurality of said strongly connected components are weighted.

4. A method of operating an analyzing system for resource allocation which comprises an input device for inputting various information for the resource allocation and an output device for outputting the result of the resource allocation and a processor;
   said processor executing with respect to a model of a graph consisting of nodes representing the status and branches representing the status transition, and including closed loops in accordance with the following steps:
   a step 1 of classifying all nodes contained in said graph into patterns, each having a given priority, based on a state of weights given to input and output branches of each node;
   a step 2 of selecting a node i from which to start a determination of the weight to each branch from among all of nodes in the graph based on results of classification in step
   a step 3 of weighting all of input branches and output branches of the selected node i so that $y \equiv \Sigma_j X_{ji} + \Sigma_j X_{ij}$ is minimized under a constraint represented by the following equation (1):

$$\Sigma_j X_{ij} - \Sigma_j X_{ji} = 0$$

$$X_{ij} \geq 0$$

wherein $X_{ji}$ is a weight of an input branch from node j to node i and $X_{ij}$ is a weight of an output branch from node i to node j;
   a step 4 of selecting a node of which input and output branches are to be weighted next time based on a state obtained by executing step 3;
   a step 5 of determining weights of all input and output branches in accordance with a method corresponding to that of step 3; and
   a step 6 of repeating steps 4 and 5 to determine weights of input and output branches for remaining nodes.

5. A method of operating an analyzing system for resource allocation according to claim 4, wherein said step 4 includes a process of selecting a next node to be an object for a next determination of the weight from among the adjacent nodes connectedly branches to the earlier processed node.

6. A method of operating an analyzing system for resource allocation according to claims 4 or 5, wherein said processor extracts strongly connected components from said graph, so as to thereby process a model obtained by removing self-closed loops from at least one of said strongly connected components.

7. A method of analyzing maximum flow of a network to a model of a graph consisting of nodes and branches and including a closed loop, which comprises:
   a step 1 of classifying all nodes contained in said graph into patterns, each having a given priority, based on a state of flow rates given to input and output branches of each node;
   a step 2 of selecting a node i from which to start a determination of the flow rate from among all of nodes in the graph based on results of classification in step 1;
   a step 3 of determining flow rates for all of the input branches and output branches of the selected node i so that $y \equiv \Sigma_j X_{ji} + \Sigma_j X_{ij}$ is minimized under a constraint represented by the following equation (1);

$$\Sigma_j X_{ij} - \Sigma_j X_{ji} = 0$$

$$X_{ij} \geq 0$$

wherein $X_{ji}$ is a flow rate of an input branch from node j to node i and $X_{ij}$ is a flow rate of an output branch from node i to node j;
   a step 4 of selecting a node for determining flow rates of its input and output branches next time based on a state obtained by executing step 3;
   a step 5 of determining flow rates of all input and output branches in accordance with a method which is substantially the same as step 3;
   a step 6 of repeating steps 4 and 5 to determine flow rates of input and output branches for remaining nodes; and
   a step 7 of detecting a branch having the maximum flow rate among all of the branches in the graph.

8. A method of analyzing maximum flow of network according to claim 7, wherein said step 4 includes a process of selecting a node to be an object for a next determination of the flow rate among the adjacent nodes connected by branches to the earlier processed nodes.

9. A method of analyzing maximum flow of a network according to claims 7 or 8, further comprising:
   a step of extracting a strongly connected component from said graph, so as to thereby obtain a branch with the maximum flow rate and the flow rate to a model obtained by removing a self-closed loop from at least one of said strongly connected components.

10. A method of scheduling to a model of a graph consisting of nodes representing the status and branches representing the status transition, and a including at least one closed loop, which comprises:
    a step 1 of classifying all nodes contained in said graph into patterns, each having a given priority, based on a state of weights given to input and output branches of each node;
    a step 2 of selecting a node i from which to start a determination of the weight to each branch from among all of nodes in the graph based on results of classification in step 1;
    a step 3 of weighting all of input branches and output branches of the selected node i so that $y \equiv \Sigma_j X_{ji} + \Sigma_j X_{ij}$ is minimized under a constraint represented by the following equation (1):

$$\Sigma_j X_{ij} - \Sigma_j X_{ji} = 0$$

$$X_{ij} \geq 0$$

wherein $X_{ji}$ is a weight of an input branch from node j to node i and $X_{ij}$ is a weight of an output branch from node i to node j;
    a step 4 of selecting a node of which input and output branches are to be weighted next time based on a state obtained by executing step 3;
    a step 5 of determining weights of all input and output branches in accordance with a method corresponding to that of step 3;
    a step 6 of repeating steps 4 and 5 to determine weights of input and output branches for remaining nodes;
    a step 7 of detecting a branch with the maximum weight from among all of the branches in the graph;
    a step 8 of removing the branch with the maximum weight detected in step 7 and, thereby, cutting said at least one closed loop including the branch; and
    a step 9 of reordering all of the nodes constituting said at least one closed loop based on a model obtained by executing step 8.

11. A method of scheduling according to claim 10, wherein said step 4 includes a process of selecting a node to be an object for a next determination of the weight from among the adjacent nodes connected by branches to the earlier processed node.

12. A method of scheduling according to claims 10 or 11, further comprising:
    a step of extracting a strongly connected component from said graph, and of removing a branch with the maximum weight from a model obtained by removing a closed loop from at least one of said strongly connected components, so that all of the nodes constituting the closed loop including the branch with the maximum weight are arranged in order.

13. A method of operating a scheduling system provided with an input device for inputting various information for the scheduling, an output device for outputting the scheduling result, and a processor;
    wherein a model of a graph consisting of nodes representing the status and branches representing the status transition and, including a closed loop is processed by said processor in accordance with a flow of procedures set beforehand;
    said flow of procedures comprising:
    a step 1 of classifying all nodes contained in said graph into patterns, each having a given priority, based on a state of weights given to input and output branches of each node;
    a step 2 of selecting a node i from which to start a determination of the weight to each branch from among all of nodes in the graph based on results of classification in step 1;
    a step 3 of weighting all of input branches and output branches of the selected node i so that $y \equiv \Sigma_j X_{ji} + \Sigma_j X_{ij}$ is minimized under a constraint represented by the following equation (1):

$$\Sigma_j X_{ij} - \Sigma_j X_{ji} = 0$$

$$X_{ij} \geq 0$$

wherein $X_{ji}$ is a weight of an input branch from node j to node i and $X_{ij}$ is a weight of an output branch from node i to node j;

a step 4 of selecting a node of which input and output branches are to be weighted next time based on a state obtained by executing step 3;

a step 5 of determining weights of all input and output branches in accordance with a method corresponding to that of step 3;

a step 6 of repeating steps 4 and 5 to determine weights of input and output branches for remaining nodes;

a step 7 of detecting a branch with the maximum weight from among all of the branches in the graph;

a step 8 of removing the branch with the maximum weight detected in step 7 and, thereby, cutting said at least one closed loop including the branch; and a step 9 of reordering all of the nodes constituting said at least one closed loop based on a model obtained by executing step 8.

14. A method of operating a scheduling system according to claim 13, wherein said step 4 includes a process of selecting a node to be an object for a next determination of the weight from among the adjacent nodes connected by branches to the earlier processed node.

15. A method of operating a scheduling system according to claims 13 or 14, wherein said flow of procedures further comprises a step of extracting strongly connected components from said graph so as to thereby process a model obtained by removing closed loops from at least one of said strongly connected components.

* * * * *